United States Patent [19]

Hanke

[11] Patent Number: 4,977,567
[45] Date of Patent: Dec. 11, 1990

[54] SEMICONDUCTOR LASER ARRANGEMENT FOR HIGH OUTPUT POWERS IN THE LATERAL FUNDAMENTAL MODE

[75] Inventor: Christian Hanke, Munich, Fed. Rep. of Germany

[73] Assignee: Siemens Aktiengesellschaft, Berlin and Munich, Fed. Rep. of Germany

[21] Appl. No.: 419,707

[22] Filed: Oct. 11, 1989

[30] Foreign Application Priority Data

Oct. 28, 1988 [DE] Fed. Rep. of Germany ....... 3836802

[51] Int. Cl.$^5$ ............................................. H01S 3/19
[52] U.S. Cl. ...................................... 372/45; 372/50; 372/92; 372/96
[58] Field of Search ....................... 372/50, 45, 46, 92, 372/108, 49, 96

[56] References Cited

U.S. PATENT DOCUMENTS

| | | | |
|---|---|---|---|
| 4,380,075 | 4/1983 | Allen, Jr. et al. | 372/44 |
| 4,594,718 | 6/1986 | Scifres et al. | 372/45 |
| 4,713,821 | 12/1987 | Bradford et al. | 372/44 |
| 4,744,089 | 5/1988 | Montroll et al. | 372/50 |
| 4,773,076 | 9/1988 | Yamamoto et al. | 372/50 |
| 4,780,879 | 10/1988 | Chinone et al. | 372/46 |
| 4,856,005 | 8/1989 | Oe et al. | 372/50 |
| 4,885,753 | 12/1989 | Okai et al. | 372/45 |

FOREIGN PATENT DOCUMENTS

| | | |
|---|---|---|
| 0095826 | 3/1983 | European Pat. Off. . |
| 0208527 | 7/1986 | European Pat. Off. . |
| 0282331 | 3/1988 | European Pat. Off. . |
| 2538471 | 9/1976 | Fed. Rep. of Germany . |
| 3125847A1 | 3/1982 | Fed. Rep. of Germany . |
| 53-107289 | 9/1978 | Japan . |

OTHER PUBLICATIONS

"Bistability in Quantum-Well Lasers", By A. I. Kucharska et al., Philips Tech. Rev. 44, No. 3, Jul. 1988, pp. 76-80.

"Optical Bistability in Semiconductor Injection Laser", by J. G. McInerney. PhD. IEE Proceedings, vol. 34, Pt. J. No. 1, Feb. 1987, pp. 41-50.

"Stable Single-Longitudinal-Mode Operation in Visible (AIGa) As Semiconductor Lasers Coupled with a Short External Cavity", by O. Yamamoto et al., J. Appl, Phys. 61 (3), Feb. 1987, pp. 870-874.

"Intercavity Coupling Gap Width Dependence In Coupled-Cavity Lasers", by L. A. Coldren et al. Electronics Letters, Apr. 12, 1984, vol. 20, No. 8, pp. 350-351.

"GaAs-AlxGal-xAs Injection Lasers with Distributed Bragg Reflectors", by F. K. Reinhart et al., Applied Physics Letters, vol. 27, No. 1, Jul. 1975, pp. 45-48.

"Injection Heterolaser with Radiation Extracted Through a Diffraction Grating ", by M. N. Mizerow et al., Sov. Phys. Semicond., vol. 8, No. 10, Apr. 1975, pp. 1321-1322.

Primary Examiner—James W. Davie
Attorney, Agent, or Firm—Hill, Van Santen, Steadman & Simpson

[57] ABSTRACT

A semiconductor laser arrangement for high output power in the lateral fundamental mode. A semiconductor laser region is provided in which a waveguide is provided for wave guidance, this waveguide being dimensioned such that the laser emission oscillates in the fundamental mode perpendicularly to its propagation direction. The arrangement has a coupling region, and an intensification region in which the lateral wave guidance is cancelled and is provided with a contact for current injection.

12 Claims, 1 Drawing Sheet

SEMICONDUCTOR LASER ARRANGEMENT FOR HIGH OUTPUT POWERS IN THE LATERAL FUNDAMENTAL MODE

BACKGROUND OF THE INVENTION

The maximum output power of AlGaAs lasers is generally limited by irreversible mirror damage that begins at a defined light power density. For enhancing output power, the emission surface of the laser can be broadened parallel to the active zone, so that the emitted light power increases for the same maximum power density. Several approaches of accomplishing this are, for example, laser array structures having a plurality of optically coupled individual stripe lasers or what are referred to as broad stripe lasers. These laser structures generally have the property that a plurality of lateral modes of the broad structure can be propagated and resonated simultaneously. This results in broad, lateral far zones having a plurality of lobes. A diffraction-limited imaging for small spot diameters is not possible with such lateral multi-mode structures.

There are a number of array structures that have large mode selection for the lateral fundamental mode. However, a stable lateral mode can be maintained over a large power spectrum only with difficulty because of technical irregularities and because of the significant interaction of light power and wave guidance.

U.S. Pat. No. 4,713,821 discloses a semiconductor laser that is composed of a laser region having an active laser stripe and of an intensification region separated therefrom by a narrow coupling region, the active layer being trapezoidal and broadened in this intensification region. The radiation coupled out in the intensification region is laterally widened and emerges from the component at an end face. This component is manufactured such that a substrate with semiconductor layers grown thereon is secured to a planar reference surface and is then cleaved along a lattice plane that forms the boundary between the laser region and the intensification region. The cleaving results in the structure having a coupling region.

U.S. Pat. No. 4,773,076 discloses a semiconductor laser wherein a continuous waveguide is fashioned as an active layer having a different width in two different regions. FIG. 1B of this patent shows the lateral dimensioning of the active layer with broken lines. The second region that is present therein does not serve as an intensification region but as a second laser resonator that is coupled with the first laser resonator. This results in a laser divided into two regions having different resonator properties because of the continuously proceeding active layer and correspondingly present resonator end faces.

SUMMARY OF THE INVENTION

It is an object of the present invention to provide a simply manufacturable semiconductor laser structure wherein the lateral fundamental mode is stable and the emission face is optimally large.

This object is achieved with an inventive semiconductor laser arrangement having a laser region provided for generating emission and provided with a first contact and with a second contact for applying an operating voltage. The arrangement also has a waveguide for lateral and vertical wave guidance with reference to the propagation direction of the emission, a mirrored, first resonator boundary surface and an exit face for the emission. A coupling region adjoins the laser region and an intensification region adjoins this coupling region located between the first resonator boundary surface and the exit face. Lateral wave guidance is cancelled in this intensification region to an extent as required for a given, lateral widening of a field of the emission. The coupling region is fashioned such that the transmissivity of this coupling region for emission from the laser region lies within prescribed limits. The waveguide is continuously fashioned from the laser region across the coupling region to the intensification region. A part of the waveguide arranged in the laser region is dimensioned such that the emission of the laser oscillates in the fundamental mode perpendicularly to its propagation direction. A third contact is provided for current injection into the intensification region.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
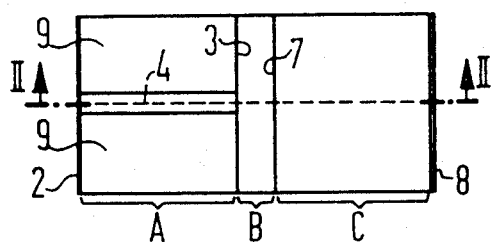
FIG. 1 shows a semiconductor laser arrangement of the present invention in a section through the waveguide parallel to the overgrown substrate surface.
Figure 2:
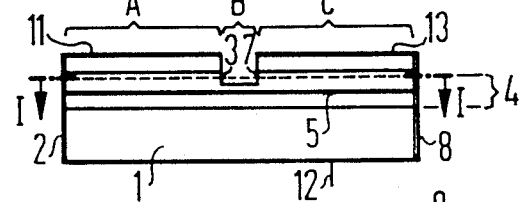
FIG. 2 shows a first embodiment of a semiconductor laser arrangement of the present invention in longitudinal section.

The present invention is composed of a semiconductor laser arrangement wherein the following elements are integrated on a common substrate 1:

1. A laser region A that, in the embodiment shown in FIGS. 1 and 2, is composed of an individual stripe laser having lateral and vertical wave guidance;
2. A coupling region B; and
3. An intensification region C in which the lateral wave guidance is cancelled.

In the exemplary embodiment depicted, the individual laser is fashioned, for example, as a BH laser (buried hetero-structure) or as a MCRW laser. The lateral wave guidance is effected by lateral regions 9 of semiconductor material suitable which laterally limit the waveguide 4. The waveguide 4 and the active layer 5 situated therein are dimensioned such that the generated laser emission resonates in the fundamental mode in both directions which are perpendicular to the propagation direction, i.e. laterally and vertically.

The lateral wave guidance is absent or is at least greatly reduced in the intensification part C; a wave guidance occurs only in a vertical direction, i.e. perpendicular to the course of the active layer 5. A relatively narrow dimensioned coupling region B lies between the laser region A and the intensification region C. This coupling region B is required in order to assure that the resonant condition is established in the laser stripe by a reflection at the end faces, i.e. of the first resonator boundary surface 2 and of the second resonator boundary surface 3 in FIG. 1. It is also required so that a part of the laser emission corresponding to the required coupling degree is capable of being coupled into the intensification region C.

The inventive construction of the coupling region B provides, in particular, three embodiments as follows. FIG. 2 shows a coupling region B in longitudinal section wherein the boundary surface between the laser region A and the coupling region B (i.e., the second resonator boundary surface 3) and the boundary surface between the coupling region B and the intensification region C (i.e., the entry face 7 for the entry of the emission into the intensification region C) are each composed of a mirror surface which is perpendicular to the propagation direction of the emission. These mirror surfaces can be manufactured by etching the semiconductor layer structure. The laser region A and the intensification region C are not completely separated from one another. Rather an incision that represents a longitudinal disturbance of the continuous waveguide 4 occurs due to a partial erosion (etching) of the transversal waveguide structure. As a result, a part of the light power is reflected back into the laser stripe, specifically through the mirroring second resonator boundary surface 3 that partially limits the laser region A. The other part is effectively coupled into the intensification region C.

Figure 4:
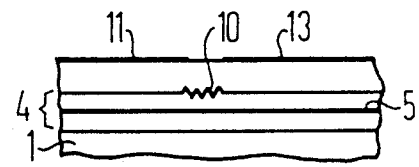
FIG. 4 shows a portion of a second embodiment.

The intentional partial reflection can also occur by incorporating a longitudinal lattice structure into the wave-guiding region. Such a (DBR) lattice 10 built into the waveguide 4 is shown in FIG. 4 and such a DBR reflector (that is a distributed Bragg reflector) also has a wavelength-selective feedback, making it possible to achieve the narrow laser stripe resonating in a single-mode longitudinally. The desired reflectivity can be set by the depth and design of the lattice 10.

Figure 5:
FIG. 5 shows a portion of a third embodiment.

FIG. 5 shows a third embodiment of the present invention wherein the entry face 17 that at least partially isolates the coupling region B from the intensification region C proceeds at an angle relative to the propagation direction of the emission. Of particular advantage is the illustrated embodiment wherein the plane of the entry face 17 is turned relative to the plane of the second resonator boundary surface 3 around an axis proceeding perpendicularly to the propagation direction, that is laterally, and specifically such that the width of the coupling region B increases in the direction pointing away from the substrate 1. Due to this slanting of the entry face 17 of the intensification part C, reflections of the optical wave are avoided during in-coupling that could lead to undesired Fabrey-Perot resonances in the coupling region B. The inclined entry face 17 can be produced, for example, by ion beam etching.

It is likewise possible to combine with one another the features present in the embodiments set forth. Thus, for example, a lattice 10 as in FIG. 4 can be additionally integrated in the embodiment of FIG. 2. In addition the second resonator boundary surface 3 of the laser region A and the entry face 7 in the intensification region C can be provided with a coating 6 of, for example, dielectric material. It must thereby only be assured that the coupling region B has an adequate reflection of a few percent for the narrow stripe laser into the laser region A so that the feedback condition for the stimulation of the laser oscillation is provided by the laser. Also, it must be guaranteed that the light power provided by the laser region A can be effectively coupled into the intensification region C.

The laser resonator in the laser region A is provided with a highly reflective layer (for example, metal, dielectric mirror of $Al_2O_3$-Si layers) at the first resonator boundary surface 2. The light emerging into the coupling region B at the second resonator boundary surface 3 is coupled into the intensification region C via the entry face 7. The lateral wave guidance is at least reduced in this intensification region C. It is also possible that the waveguide layer in this intensification region C extends over the entire width of the structure.

A first metal contact 11 is applied on the surface of the laser region A; a second metal contact 12 is located on the underside of the substrate 1; and a third contact 13 is applied to the intensification region C. This third contact 13 is formed such that it provides a current injection into the region in which the light coming from the laser propagates while spreading the beam path. The exit face 8 of the intensification region C is anti-reflection coated by a dielectric coating (for example, $Al_2O_3$ layers) of the semiconductor body, so that no reflection of the emission back into the laser-active region can occur.

Figure 3:
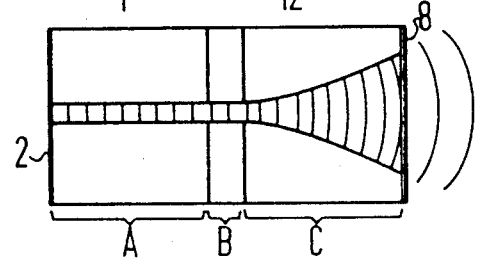
FIG. 3 shows the propagation of the wave fronts of the laser emission in a semiconductor laser of the present invention in the section corresponding to FIG. 1.

The optical wave that is coupled from the narrow laser stripe in the laser region A into the intensification region C via the coupling region B oscillates in the lateral fundamental mode due to the dimension of the waveguide 4 in the laser region A and spreads laterally in a quasi-free beam (aperture angle 5°-10°) since the intensification region C has no lateral wave guidance or a reduced lateral wave guidance. The lateral fundamental mode is preserved in the widening of the ray beam up to the exit face 8 (FIG. 3). The wave is guided in a vertical direction by the vertical layer structure of the waveguide 4. This guidance is also present in the intensification region C. By suitable current injection into the intensification region C via the third contact 13, this intensification region C that has the same vertical layer structure as the laser region A uses stimulated emission to provide an optical intensification that intensifies the traversing optical wave up to the exit face 8. High output powers for preservation of the lateral fundamental mode can be achieved with this principle and with the lateral widening of the wave.

The laser arrangement of the present invention can be simply manufactured because the laser region A and the intensification region C can be grown on a common substrate 1 and the coupling region B can be easily fashioned in a form optimized for the intended function, being fashioned with a following etching step or by integration of a DBR lattice. In addition to improved functioning, the laser arrangement of the present invention also provides a higher percentage yield of functional components in production than could be expected given traditional embodiments.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A semiconductor laser arrangement having a laser region (A) provided for generating emission and provided with a first contact (11) and with a second contact

(12) for applying an operating voltage, having a waveguide (4) for lateral and vertical wave guidance with reference to the propagation direction of the emission, having a mirrored, first resonator boundary surface (2) and having an exit face (8) for the emission, comprising a coupling region (B) adjoining the laser region (A) and an intensification region (C) adjoining this coupling region (B) located between the first resonator boundary surface (2) and the exit face (8), lateral wave guidance being at least greatly reduced in this intensification region (C); the coupling region (B) having a configuration which causes the transmissivity of this coupling region (B) for emission from the laser region (A) to be within prescribed limits; the waveguide (4) being continuously fashioned from the laser region (A) across the coupling region (B) to the intensification region (C); a part of the waveguide (4) arranged in the laser region (A) having a lateral dimension and a vertical dimension which effect an oscillation of the emission of the laser in the fundamental mode perpendicularly to its propagation direction; and a third contact (13) provided for current injection into the intensification region (C).

2. The semiconductor laser arrangement according to claim 1, wherein the coupling region (B) is partially limited in the direction toward the laser region (A) by a second resonator boundary surface (3) and is partially limited in the direction toward the intensification region (C) by an entry face (7).

3. The semiconductor laser arrangement according to claim 2, wherein the second resonator boundary surface (3) and the entry face (7) are provided with coatings (6) for setting the transmissivity.

4. The semiconductor laser arrangement according to claim 2, wherein the entry face (17) is arranged proceeding at a slant relative to the second resonator boundary surface (3).

5. The semiconductor laser arrangement according to claim 1, wherein a lattice (10) is fashioned in the coupling region (B) as a distributed Bragg reflector (DBR).

6. A semiconductor laser arrangement having a laser region (A) provided for generating emission and provided with a first contact (11) and with a second contact (12) for applying an operating voltage, having a waveguide (4) for lateral and vertical wave guidance with reference to the propagation direction of the emission, having a mirrored, first resonator boundary surface (2) and having an exit face (8) for the emission, comprising a coupling region (B) adjoining the laser region (A) and an intensification region (C) adjoining this coupling region (B) located between the first resonator boundary surface (2) and the exit face (8), lateral wave guidance being at least greatly reduced in this intensification region (C); the coupling region (B) having a configuration which causes the transmissivity of this coupling region (B) for emission from the laser region (A) to be within prescribed limits; the waveguide (4) being continuously fashioned from the laser region (A) across the coupling region (B) to the intensification region (C); a part of the waveguide (4) arranged in the laser region (A) having a lateral dimension and a vertical dimension which effect an oscillation of the emission of the laser in the fundamental mode perpendicularly to its propagation direction; and a third contact (13) provided for current injection into the intensification region (C); the coupling region (B) being partially limited in the direction toward the laser region (A) by a second resonator boundary surface (3) and being partially limited in the direction toward the intensification region (C) by an entry face (7).

7. The semiconductor laser arrangement according to claim 6, wherein the second resonator boundary surface (3) and the entry face (7) are provided with coatings (6) for setting the transmissivity.

8. The semiconductor laser arrangement according to claim 6, wherein the entry face (17) is arranged proceeding at a slant relative to the second resonator boundary surface (3).

9. The semiconductor laser arrangement according to claim 6, wherein a lattice (10) is fashioned in the coupling region (B) as a distributed Bragg reflector (DBR).

10. A semiconductor laser arrangement having a laser region (A) provided for generating emission and provided with a first contact (11) and with a second contact (12) for applying an operating voltage, having a waveguide (4) for lateral and vertical wave guidance with reference to the propagation direction of the emission, having a mirrored, first resonator boundary surface (2) and having an exit face (8) for the emission, comprising a coupling region (B) adjoining the laser region (A) and an intensification region (C) adjoining this coupling region (B) located between the first resonator boundary surface (2) and the exit face (8), lateral wave guidance being at least greatly reduced in this intensification region (C); the coupling region (B) having a configuration which causes the transmissivity of this coupling region (B) for emission from the laser region (A) to be within prescribed limits; the waveguide (4) being continuously fashioned from the laser region (A) across the coupling region (B) to the intensification region (C); a part of the waveguide (4) arranged in the laser region (A) having a lateral dimension and a vertical dimension which effect an oscillation of the emission of the laser in the fundamental mode perpendicularly to its propagation direction; and a third contact (13) provided for current injection into the intensification region (C); the coupling region (B) being partially limited in the direction toward the laser region (A) by a second resonator boundary surface (3) and being partially limited in the direction toward the intensification region (C) by an entry face (7); the second resonator boundary surface (3) and the entry face (7) being provided with coatings (6) for setting the transmissivity.

11. The semiconductor laser arrangement according to claim 10, wherein the entry face (17) is arranged proceeding at a slant relative to the second resonator boundary surface (3).

12. The semiconductor laser arrangement according to claim 10, wherein a lattice (10) is fashioned in the coupling region (B) as a distributed Bragg reflector (DBR).

* * * * *